June 13, 1967 W. E. SONNTAG, JR 3,325,312

THERMOELECTRIC PANELS

Filed June 14, 1962

INVENTOR.
WALLACE E. SONNTAG, JR.
BY Frank N. Decker Jr.
ATTORNEY.

3,325,312

THERMOELECTRIC PANELS

Wallace E. Sonntag, Jr., Fayetteville, N.Y., assignor to Carrier Corporation, Syracuse, N.Y., a corporation of Delaware Filed June 14, 1962, Ser. No. 202,492
3 Claims. (Cl. 136—212)

Figure 1:
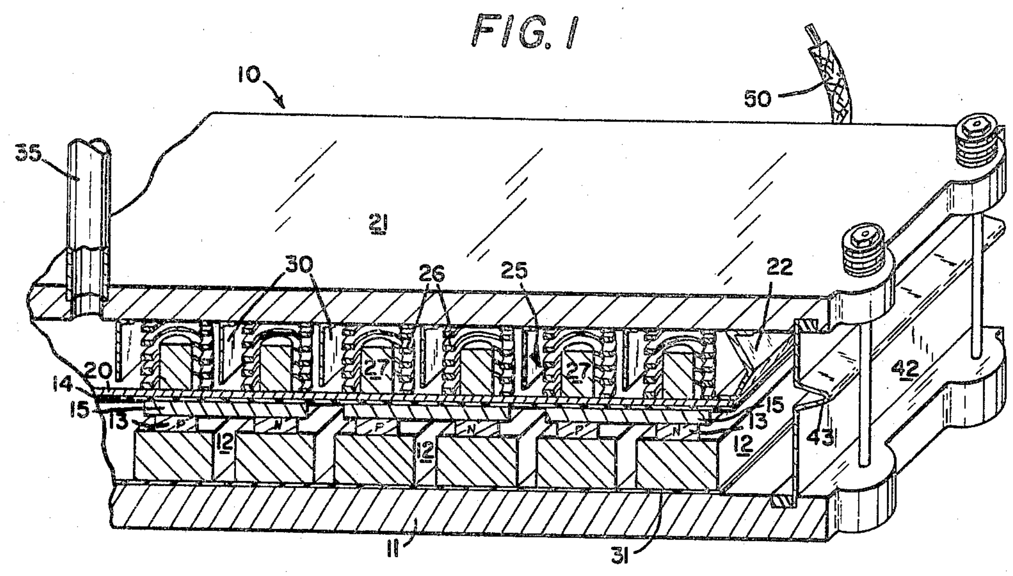

This invention relates to thermoelectric devices, more particularly to means implementing the formation of a thermoelectric panel so as to insure adequate electrical contact between the circuit components of the panel during the normally encountered wide temperature range to which the panel is subjected.

In utilizing thermoelectric principles to provide desired heat transfer effects, or to generate electricity, a plurality of pairs of thermoelectric elements are generally joined together in a planar configuration to form a panel member. Where the panel is utilized for thermoelectric generation in accordance with the Seebeck effect, one side of the panel is subjected to heat, while the other side of the panel is arranged in heat exchange relationship with a coolant so as to dissipate any heat given off. The temperature difference between the junctions of the thermoelectric elements produces a flow of current. Where the panel is utilized for heat transfer purposes, one side of the panel is arranged to absorb heat from the area to be cooled, while the other side, as in connection with the thermoelectric generator, is arranged in heat exchange relationship with a coolant fluid medium. The passage of current through the thermoelectric elements produces a temperature differential between the junctions of the thermoelectric elements. The heat absorbing side of the panel is formed of a plate member electrically insulated from the thermoelectric elements, but in heat exchange relationship therewith. Similarly, the heat dissipating side of the panel is formed of a plate member in heat exchange relationship with the opposite junctions of the thermoelectric elements but electrically insulated therefrom.

It is found that these plate members making up the panel are subject to extensive distortion under the varying temperature conditions to which the panel is subject. Where, as in conventional practice, the plate members function to maintain contact between the bridges which make electrical contact between the thermoelectric elements and form the thermoelectric junctions, the distortions produced by temperature changes often impair the contact between the electrical components so as to build up undesired contact resistance. Additionally, the plate distortion results in warpage of the panel member affecting its structural strength.

It is with the above problems and desiderata in mind that the present means have been evolved, means including both method and apparatus implementing the formation of a thermoelectric panel so as to minimize warpage, and eliminate the deleterious effects thereof on electrical circuit connections and panel strength.

It is accordingly a primary object of this invention to provide improved means implementing the formation of a thermoelectric panel so as to eliminate the heretofore encountered deleterious effects of temperature variations in the panel.

Another object of the invention is to provide improved means for forming a thermoelectric panel insuring uniform pressure contacts over an entire face of the thermoelectric panel.

A further object of the invention is to provide a novel thermoelectric panel construction in which desired structural strength will be maintained under varying temperature conditions.

It is also an object of the invention to provide means implementing the cooling of the heat dissipating plate of a thermoelectric panel.

These and other objects of the invention which will become hereafter apparent are achieved in one embodiment thereof by forming the heat dissipating plate of a thermoelectric panel of a flexible material. Arranged at spaced intervals with respect to this plate are a plurality of wall members which define flow paths for any coolant to be used. In assembled relationship, the flexible plate is arranged in heat exchange relationship with the heat dissipating junctions of thermoelectric elements. The wall members extend from the side of the plate remote from the thermoelectric bridges. Spring members are sandwiched between the flexible plate and a relatively rigid coolant conduit housing to bias the flexible plate against the bridges. The wall members form the flow paths for the coolant between the conduit housing and the flexible panel as will become hereafter more apparent.

An important feature of the invention resides in the relatively flexible heat sink plate which serves to take up the stresses produced by temperature differentials in the panel.

Another feature of the invention resides in the use of the loading springs which serve to insure desired pressure bonds between the components of the thermoelectric circuit.

An additional feature resides in the coolant conduit walls which serve to permit flexibility so as to accommodate temperature change stresses.

Figure 2:
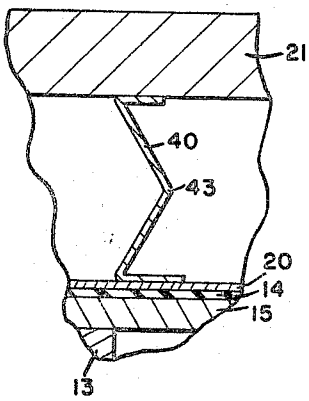

These and other objects of the invention will become apparent from the following detailed description of a preferred embodiment thereof together with the accompanying illustrative drawing, wherein:

FIGURE 1 is a perspective view of a portion of a novel panel, partially cut away in cross-section to reveal the details of the invention; and FIGURE 2 is a cross-sectional view of a detail of another embodiment of the invention illustrating an alternative conduit wall structure.

Referring now more particularly to the drawing, like numerals in the various figures will be employed to designate like parts.

As best seen in FIGURE 1, the novel panel 10 comprises a relatively rigid heat source plate 11 formed of a material such as Inconel or the like. A plurality of conductor straps or bridge members 12 formed of iron or the like are arranged adjacent plate 11 and suitably insulated therefrom by a sheet of electrical insulation 31. Bridge members 12 absorb heat from plate 11 by contact therewith. Plate 11 is heated by a suitable heat source (not shown) such as a gas burner. The bridge members in turn contact thermoelectric elements 13 which are here designated as 13 "P" and 13 "N" respectively to designate "N" and "P" type thermoelectric elements. The heat dissipating junctions of the thermoelectric elements are formed by heat dissipating bridges 15 made of copper or the like. Copper heat dissipating bridges 15 may be bonded by soldering or the like to the thermoelectric elements 13.

Bridges 12 and 15, and the thermoelectric elements joined thereby form a continuous electrical circuit throughout the panel 10. The copper heat dissipating bridges 15 are electrically insulated from adjacent sink plate 20 by the use of a sheet of heat transmissible electrical insulation 14, such as mica. The heat absorbing iron bridges 12 which are subject to relatively high temperatures are electrically insulated from adjacent plate 11 by utilization of a sheet of mica 31 or the like.

This electrically insulated thermoelectric circuit is sandwiched between heat absorbing rigid plate 11, such as Inconel, and a novel heat dissipating flexible plate 20.

Flexible plate 20 is part of a heat dissipating arrangement 25 comprising a relatively rigid coolant conduit housing plate 21 joined to the flexible heat sink plate 20 by means of a suitable panel seal 22 such as seen to the right in FIGURE 1. Panel seal 22 may be generally S-shaped in cross-section, as shown in FIGURE 1, and securely joined at its end to the housing sheet 21 and the heat sink plate 20 to provide a water-tight connection therebetween. The enclosure between heat sink plate 20 houses a plurality of coil spring members 26 arranged preferably one adjacent to and overlying each thermoelectric element 13.

Secured to heat sink plate 20 are a plurality of pin fins 27 serving to extend the heat transfer surface of the heat sink plate. It will be understood that the fin arrangement may assume any desired form without departing from the scope of the instant invention. In the illustrated preferred embodiment, pin fins are arranged one for each thermoelectric element concentric with and lying within the confines of helical loading coil springs 26.

In the embodiment of the invention illustrated in FIGURE 1, coolant conduit walls or strips 30 are shown formed of strips of L-shaped metal with the relatively shorter horizontal leg of the L secured to the coolant conduit housing sheet, and the vertically extending leg of the L reaching down towards, but not contacting, the heat sink plate 20. The clearance between the conduit wall 30 and heat sink plate 20 is sufficient to permit ready flexing of the heat sink plate without interfering with walls 30. However, coolant directed into the envelope via inlet 35 will be channeled by walls 30 along desired flow paths.

In the form of the invention illustrated in FIGURE 2, the conduit wall has been modified so that a flexible arrangement may be utilized. In the FIGURE 2 embodiment, conduit side wall 40 is shown as having a sigma shape and is secured at opposite ends to the relatively stiff conduit housing sheet 21 and the flexible heat sink plate 20. Flexing of plate 20 is taken up at the knee of the sigma shaped conduit wall 40.

The panel may be maintained in assembled relationship by extending a panel gas seal 42 between conduit housing 21 and heat source plate 11. Gas seal 42 is formed with an expansion joint 43 so that a relatively gas tight envelope may readily be formed to surround the components making up the thermoelectric circuit. Conventional insulating gases may be utilized within the panel envelope. Any suitable means 50 is provided for attaching current leads to the thermoelectric panel and bringing them out through the panel assembly. Suitable spring loaded fastening means are desirably used to draw plates 11 and 21 together in order to maintain substantially constant pressure on springs 26 to maintain electrical contact between the thermoelectric elements and the bridges.

In use, the above described thermoelectric structure may be employed either for heat pumping, or electrical generation depending on whether it is used in accordance with Peltier or Seebeck principles, respectively. Thus, according to Peltier the passage of a direct current through dissimilar thermoelectric elements results in the absorption of heat at one junction and the emission of heat at another junction between the dissimilar metals. Reversibly, in accordance with Seebeck theory, the application of heat at one junction of different thermoelectric elements to provide a temperature differential between the heated junction and another junction results in the generation of a direct current in the circuit containing the thermoelectric elements.

In the instant disclosure, the novel structure is designed primarily for use in conjunction with electrical generation, but it will be apparent to those skilled in the art that similar embodiments of the inventive concept may be employed in conjunction with heat pumping installations. In view of the heat applied to the heat absorbing bridges 12, it is found desirable to utilize a simple pressure contact between the bridges, the thermoelectric elements 13, and the rigid heat source plate 11, thus eliminating the problems involved in utilizing a bonding agent at high temperatures (between 1200 and 1500° F. in one practical installation).

In use, the novel panel 10 is arranged with heat source plate 11 in heat exchange relationship with a heat source such as an oil burner flame or the like. A water connection is made to coolant inlet 35 from some suitable water supply source. The flow of water through the envelope provided between coolant conduit housing plate 21 and the flexible heat sink plate 20 results in a temperature differential between the heat absorbing bridges 12 and the heat dissipating bridges 15. In a practical installation, a temperature differential of approximately 1000° F. is found readily obtainable with a temperature of 1200° F. at the heat source plate 11 and approximately 200° F. at the heat sink plate 20.

As a result of this temperature differential between bridges 12 and 15 respectively, a direct current is generated in the circuit containing bridges 12, thermoelectric elements 13 and bridges 15. This current is taken from the panels in any suitable fashion, such for example as by means of current lead 50.

Distortions in the panel resulting from temperature variations either during normal operation, or between start-up and shut-down are accommodated by the flexible heat sink plate 20 and either by the spacing between conduit walls 30, or the flexing of the conduit wall 40 as shown in FIGURE 2. The loading springs 26 serve to exert a relatively constant pressure on the flexible plate 20 so that the pressure bond between the thermoelectric elements 13, heat absorbing junctions 12 and heat source plate 11 is maintained relatively constant.

It is thus seen that an improved thermoelectric panel structure has been provided including a novel heat sink plate assembly, in which the flexibility of the heat sink plate assembly accommodates distortions produced by temperature variations while at the same time permitting ready utilization of coolant materials in heat exchange relationship with the heat dissipating thermoelectric junctions; and also permitting the maintenance of desired uniform pressure bonds in the heat absorbing sections of the thermoelectric panel without requiring the use of high temperature bonding agents.

The above disclosure has been given by way of illustration and elucidation, and not by way of limitation, and it is desired to protect all embodiments of the herein disclosed inventive concept within the scope of the appended claims.

I claim:

1. A thermoelectric panel comprising:

a first, relatively rigid, plate;

a second, relatively rigid, plate secured in spaced relation with said first plate;

a relatively flexible plate disposed between and in spaced relation with said first and second rigid plates;

a plurality of thermoelectric elements, having dissimilar thermoelectric power, connected to form thermoelectric junctions of differing types, disposed between said first rigid plate and said flexible plate, so that junctions of one type are each disposed adjacent said one rigid plate and junctions of another type are each disposed adjacent said flexible plate;

electrical insulation means disposed between said thermoelectric elements and said first plate and between said thermoelectric elements and said flexible plate; and resilient spring means disposed so as to exert pressure between said flexible plate and said second rigid plate, said resilient means overlying said thermoelectric elements to exert resilient pressure on said thermoelectric elements through flexing of said flexible plate.

2. A thermoelectric panel comprising:

a first, relatively rigid, plate;

a second, relatively rigid, plate secured in spaced relation with said first plate;

a relatively flexible, heat conductive, metal plate disposed between and in spaced relation with said first and second rigid plates;

a plurality of thermoelectric elements, having dissimilar thermoelectric power, connected to form thermoelectric junctions of differing types, disposed between said first rigid plate and said flexible plate, so that junctions of one type are each disposed adjacent said first rigid plate and junctions of another type are each disposed adjacent said flexible plate;

electrical insulation means disposed between said thermoelectric elements and said first plate and between said thermoelectric elements and said flexible plate;

a plurality of resilient spring means disposed under compression so as to exert pressure between said flexible plate and said second rigid plate, said resilient means overlying said thermoelectric elements to exert compression on said thermoelectric elements through flexing of said flexible plate; and means to pass a heat exchange fluid through the space between said flexible plate and said second plate in heat transfer relation through said flexible plate with the thermoelectric junctions adjacent said flexible plate.

3. A thermoelectric panel comprising:

a first, relatively rigid, plate;

a second, relatively rigid, plate secured in spaced relation with said first plate;

a relatively flexible, heat conductive, metal plate disposed between and in spaced relation with said first and second rigid plates;

a plurality of thermoelectric elements, having dissimilar thermoelectric power, connected to form thermoelectric junctions of differing types, disposed between said first rigid plate and said flexible plate, so that junctions of one type are each disposed adjacent said first rigid plate and junctions of another type are each disposed adjacent said flexible plate;

electrical insulation means disposed between said thermoelectric elements and said first plate and between said thermoelectric elements and said flexible plate;

a plurality of resilient means disposed under compression so as to exert pressure between said flexible plate and said second rigid plate, said resilient means overlying said thermoelectric elements to exert compression on said thermoelectric elements through flexing of said flexible plate;

means to pass a heat exchange fluid through the space between said flexible plate and said second plate in heat transfer relation through said flexible plate with the thermoelectric junctions adjacent said flexible plate; and said resilient means comprising a resilient helical coil spring and thermoelectric panel including heat conducting fin members secured to said flexible plate and extending into each of said resilient coil springs to enhance heat transfer between the thermoelectric junctions adjacent said flexible plate and said heat exchange medium.

References Cited

UNITED STATES PATENTS

| | | | |
|---|---|---|---|
| 3,006,979 | 10/1961 | Rich | 136—4. |
| 3,082,275 | 3/1963 | Talaat | 136— |
| 3,082,276 | 3/1963 | Corry et al. | 136—20 |
| 3,111,432 | 11/1963 | Sickert et al. | 136— |
| 3,269,875 | 8/1966 | White | 136—23 |

WINSTON A. DOUGLAS, *Primary Examiner.*

JOHN H. MACK, *Examiner.*

D. L. WALTON, *Assistant Examiner.*